(12) United States Patent
Kholodenko

(10) Patent No.: US 6,908,540 B2
(45) Date of Patent: Jun. 21, 2005

(54) METHOD AND APPARATUS FOR ENCAPSULATION OF AN EDGE OF A SUBSTRATE DURING AN ELECTRO-CHEMICAL DEPOSITION PROCESS

(75) Inventor: Arnold Kholodenko, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 297 days.

(21) Appl. No.: 09/905,513

(22) Filed: Jul. 13, 2001

(65) Prior Publication Data

US 2003/0010640 A1 Jan. 16, 2003

(51) Int. Cl.[7] .................................................. C25D 5/02
(52) U.S. Cl. .................................. 205/118; 204/224 R
(58) Field of Search ....................... 205/118; 204/224 R

(56) References Cited

U.S. PATENT DOCUMENTS

| | | |
|---|---|---|
| 4,428,815 A | 1/1984 | Powell et al. |
| 4,696,729 A | 9/1987 | Santini |
| 4,948,486 A | 8/1990 | Hosten |
| 5,227,041 A | 7/1993 | Brogden et al. |
| 5,292,137 A | 3/1994 | Simmons et al. |
| 5,356,158 A | 10/1994 | Simmons et al. |
| 5,405,518 A | 4/1995 | Hsieh et al. |
| 5,447,615 A | 9/1995 | Ishida |
| 5,522,975 A | 6/1996 | Andricacos et al. |
| 5,744,019 A | 4/1998 | Ang |
| 5,785,826 A | 7/1998 | Greenspan |

(Continued)

FOREIGN PATENT DOCUMENTS

| | | | |
|---|---|---|---|
| DE | 198 03 490 | 10/1998 | ......... H01L/21/288 |
| EP | 1 010 780 | 6/2000 | ........... C25D/17/12 |
| EP | 1 103 639 | 5/2001 | ........... C25D/17/00 |
| GB | 1074607 | 7/1967 | |
| WO | 99/54920 | 10/1999 | |

OTHER PUBLICATIONS

U.S. patent application Ser. No. 09/912,578, Kholodenko et al., filed Jul. 24, 2001.
Pitney, K. E., "Ney Contact Manual," The J.M. Ney Company, (1973), pp. 1–13, 88–91 and 148–165, no month.
Ney Contact Manual, by Kenneth E. Pitney, The J.M. Ney Company (1973), no month.
International Search Report dated Nov. 15, 2002 for corresponding PCT/US02/21432 provided as a concise explanation for reference B4. (DE 198 03 490).

*Primary Examiner*—Wesley A. Nicolas
(74) *Attorney, Agent, or Firm*—Moser, Patterson & Sheridan

(57) ABSTRACT

An electro-chemical deposition method and apparatus that encapsulates a substrate's edge to prevent deposition thereon is generally provided. In one embodiment, the apparatus includes a contact ring, one or more electrical contact pads disposed on the contact ring and a thrust plate axially movable relative to the contact ring. A first seal is disposed inward of the contact pad and seals with the contact ring. A second seal is coupled to the thrust plate. The first and second seals are adapted to sandwich the substrate therebetween when the contact ring and the thrust plate are moved towards each other. In another embodiment, a third seal provides a seal between the thrust plate and contact ring, and, with the first and second seals, defines an exclusion zone encapsulating the substrate's edge. One or more electrical contact pads are protected from the electrolyte by being disposed within the exclusion zone.

32 Claims, 8 Drawing Sheets

U.S. PATENT DOCUMENTS

| | | |
|---|---|---|
| 5,807,469 A * | 9/1998 | Crafts et al. ............ 204/297.06 |
| 5,853,559 A | 12/1998 | Tamaki et al. |
| 5,885,469 A * | 3/1999 | Kholodenko et al. ......... 216/11 |
| 5,980,706 A | 11/1999 | Bleck et al. |
| 5,985,126 A | 11/1999 | Bleck et al. |
| 6,001,234 A | 12/1999 | Batz, Jr. et al. |
| 6,004,440 A | 12/1999 | Hanson et al. |
| 6,004,828 A | 12/1999 | Hanson |
| 6,071,388 A | 6/2000 | Uzoh |
| 6,080,289 A | 6/2000 | Palmatier et al. |
| 6,080,291 A * | 6/2000 | Woodruff et al. ...... 204/297.01 |
| 6,090,711 A | 7/2000 | Batz, Jr. et al. |
| 6,139,703 A | 10/2000 | Hanson et al. |
| 6,139,712 A | 10/2000 | Patton et al. |
| 6,156,167 A | 12/2000 | Patton et al. |
| 6,159,354 A | 12/2000 | Contolini et al. |
| 6,176,992 B1 | 1/2001 | Talieh et al. ................... 205/87 |
| 6,193,859 B1 | 2/2001 | Contolini et al. |
| 6,228,233 B1 | 5/2001 | Lakshmikanthan et al. |
| 6,248,222 B1 | 6/2001 | Wang |
| 6,251,235 B1 | 6/2001 | Talieh et al. ................. 204/220 |
| 6,251,236 B1 | 6/2001 | Stevens |
| 6,270,647 B1 | 8/2001 | Graham et al. |
| 6,274,013 B1 | 8/2001 | Bleck et al. |
| 6,309,524 B1 | 10/2001 | Woodruff et al. |
| 6,358,388 B1 | 3/2002 | Bleck et al. |
| 6,391,166 B1 | 5/2002 | Wang |
| 6,423,636 B1 | 7/2002 | Dordi et al. |
| 6,482,307 B2 | 11/2002 | Ashjaee et al. |
| 6,497,800 B1 | 12/2002 | Talieh et al. |

* cited by examiner

METHOD AND APPARATUS FOR ENCAPSULATION OF AN EDGE OF A SUBSTRATE DURING AN ELECTRO-CHEMICAL DEPOSITION PROCESS

BACKGROUND OF THE INVENTION

1. Field of the Invention

Embodiments of the invention generally relate to a method and apparatus for electrochemical deposition of a conductive material on a substrate.

2. Background of the Related Art

Sub-quarter micron, multi-level metallization is one of the key technologies for the next generation of ultra large scale integration (ULSI). The multilevel interconnects that lie at the heart of this technology require planarization of interconnect features formed in high aspect ratio apertures, including vias, contacts, lines, plugs and other features. Reliable formation of these interconnect features is very important to the success of ULSI and to the continued effort to increase circuit density and quality on individual substrates and die.

As circuit densities increase, the widths of vias, contacts, lines, plugs and other features, as well as the dielectric materials between them, decrease to less than 250 nanometers, whereas the thickness of the dielectric layers remains substantially constant, with the result that the aspect ratios for the features, ie., their height divided by width, increases. Due to copper's good electrical performance at such small feature sizes, copper has become a preferred metal for filling sub-quarter micron, high aspect ratio interconnect features on substrates. However, many traditional deposition processes, such as physical vapor deposition (PVD) and chemical vapor deposition (CVD), have difficulty filling structures with copper material where the aspect ratio exceeds 4:1, and particularly where it exceeds 10:1. As a result of these process limitations, electroplating, which had previously been limited to the fabrication of lines on circuit boards, is now being used to fill vias and contacts on semiconductor devices.

Metal electroplating is generally known and can be achieved by a variety of techniques. A typical method generally comprises deposition of a barrier layer over the feature surfaces, followed by deposition of a conductive metal seed layer, preferably copper, over the barrier layer, and then electroplating a conductive metal over the seed layer to fill the structure/feature. After electroplating, the deposited layers and the dielectric layers are planarized, such as by chemical mechanical polishing, to define a conductive interconnect feature.

While present day electroplating cells achieve acceptable results on larger scale substrates, a number of obstacles impair consistent reliable electroplating onto substrates having micron-sized, high aspect ratio features. Generally, these obstacles include providing uniform power distribution and current density across the substrate plating surface to form a metal layer having uniform thickness and preventing unwanted edge and backside deposition to minimize and control contamination of the substrate being processed as well as subsequent substrates. For example, the electrical contacts between the substrate and the deposition system are often exposed to the plating fluid (e.g., electrolyte) and subsequently become contaminated with deposition material or other contaminants that reduce the contact area between the substrate and contacts. The reduced or irregular contact area disrupts uniform biasing of the substrate that results in non-uniform plating.

Moreover, the position of the contacts relative to the center of the substrate may additionally create non-uniform power distribution over the substrate. Thus, cell tooling for positioning the contacts relative to the substrate must have tight tolerances to ensure proper centering of the substrates. Tight tolerance requirements are generally undesirable due to the increase in part, assembly and quality assurance costs.

Therefore, there is a need for an improved electrochemical deposition system.

SUMMARY OF THE INVENTION

An electrochemical deposition method and apparatus that encapsulates an edge of a substrate thus substantially preventing deposition thereon is generally provided. In one embodiment, the electrochemical deposition apparatus includes an annular contact ring, one or more electrical contact pads disposed on the contact ring and a thrust plate adapted to move axially relative to the contact ring. A first seal is disposed inward of the electrical contact pad and provides a seal with the contact ring. A second seal is coupled to the thrust plate. The first and second seals are adapted to sandwich the substrate therebetween when the contact ring and the thrust plate are moved towards each other.

In another embodiment, an apparatus for electrochemical deposition on a substrate includes an annular contact ring, one or more electrical contact pads disposed on the contact ring and a thrust plate adapted to move axially relative to the contact ring. A first seal is disposed inward of the electrical contact pad and is in sealing communication with the contact ring. A second seal and third seal are coupled to the thrust plate. The third seal, which is disposed radially outward of the second seal, provides a seal between the contact ring and the thrust plate when the contact ring and the thrust plate are moved towards each other.

In another embodiment, an apparatus for electrochemical deposition on a substrate includes an annular contact ring having a conductive body covered by an insulative covering and a thrust plate adapted to move axially relative to the contact ring. A first means is provided for sealing the contact ring to a feature side of the substrate while a second means is provided for sealing the thrust plate to a backside side of the substrate. The first and second means generally define an inner boundary of an exclusion zone encapsulating an edge of the substrate. One or more electrical contact pads are formed within the exclusion zone by removing a portion of the insulative covering of the contact ring.

In another embodiment, an apparatus for electro-chemical deposition on a substrate includes a container body, an anode disposed in the container body and a head assembly. The head assembly generally includes a thrust plate that is adapted to move axially relative to an annular contact ring. The contact ring generally comprises a conductive body covered by an insulative covering. A first seal, a second seal and a third seal respectively provide a seal between the contact ring and a feature side of the substrate, a seal between the thrust plate and a backside side of the substrate, and a seal between the thrust plate and the contact ring. The first, second and third seal bound an exclusion zone that encapsulates an edge of the substrate. One or more electrical contact pads that are adapted to bias the substrate are disposed in the exclusion zone. An electrolyte inlet is positioned to supply electrolyte to an area of the substrate disposed radially inward of the first seal.

In another aspect of the invention, methods of plating a substrate are provided. In one embodiment, a method of plating a substrate includes the steps of positioning the substrate in a contact plate, creating a first fluid seal between a feature side of the substrate and the contact ring, creating a second fluid seal between a thrust plate and the contact ring radially outward of the substrate, and exposing a surface of the substrate disposed radially inward of the first seal to an electrolyte.

In another embodiment, a method of plating a substrate includes the steps of creating a first fluid seal between a backside of the substrate and a thrust plate, creating a second fluid seal between a feature side of the substrate and a contact ring, creating a third fluid seal between the thrust plate and the contact ring radially outward of the substrate and exposing a surface of the substrate disposed radially inward of the second seal to an electrolyte.

In another embodiment, a method of plating a substrate includes the steps of creating a first fluid seal in communication with a backside of the substrate, creating a second fluid seal in communication with a feature side of the substrate, creating a third fluid seal radially outward of the substrate, the third seal encapsulating an edge of the substrate with the first and second seals and exposing a surface of the substrate disposed radially inward of the second seal to an electrolyte.

In yet another embodiment, a method of plating a substrate includes the steps of chucking the substrate to a thrust plate, moving the substrate to sealingly contact a feature side of the substrate with a first fluid seal, deforming the first fluid seal to sealingly contact a contact ring, sealing the thrust plate and the contact ring radially outward of the substrate, and exposing a surface of the substrate disposed radially inward of the first seal to an electrolyte.

BRIEF DESCRIPTION OF THE DRAWINGS

So that the manner in which the above recited features and advantages of the invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Figure 1:
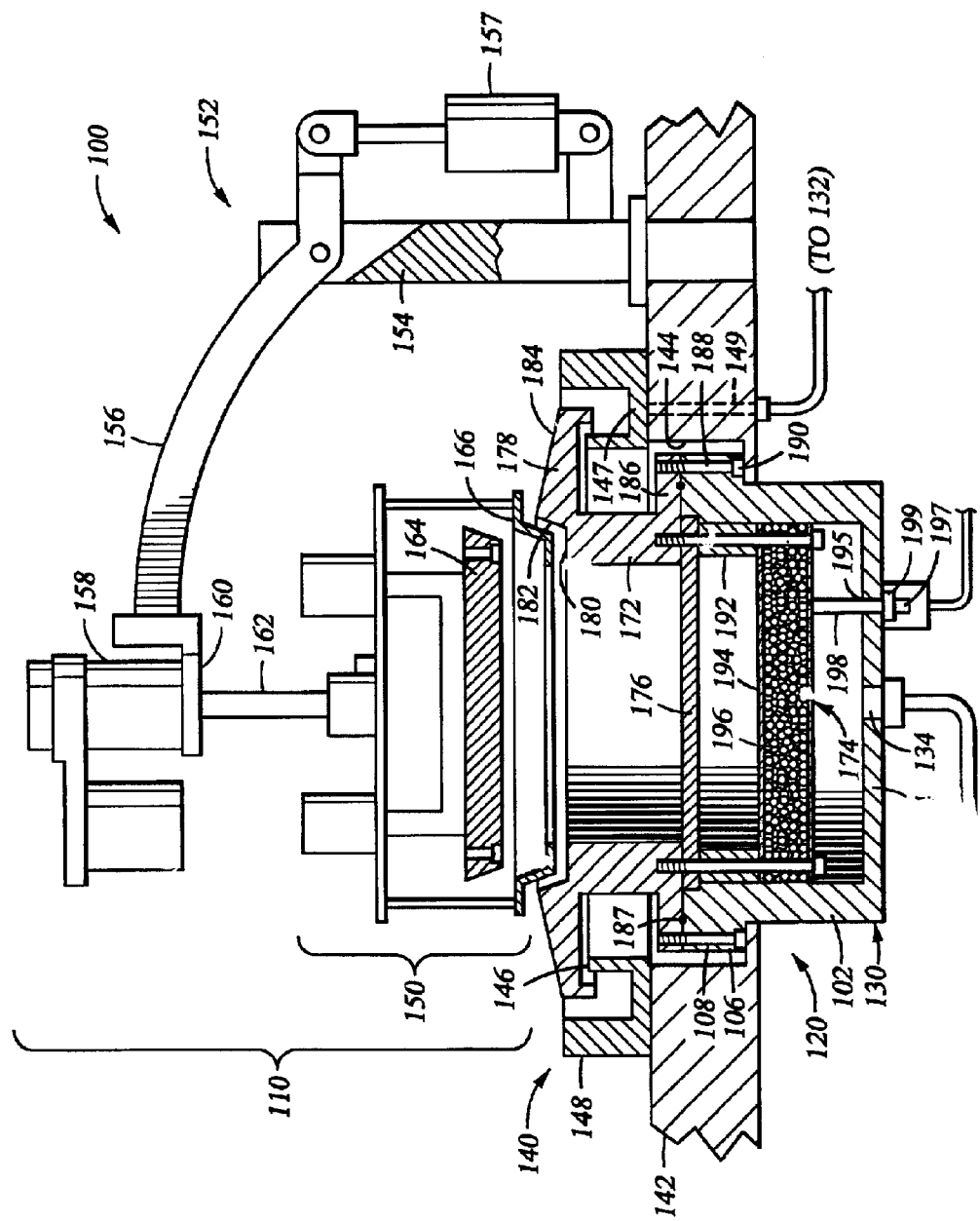
FIG. 1 is a cross sectional view of an electroplating process cell 400 according to the invention.

FIG. 1 is a cross sectional view of an electroplating process cell 100 according to the invention. The processing cell 100 generally comprises a head assembly 110, a process kit 120 and an electrolyte collector 140. Preferably, the electrolyte collector 140 is secured onto the base 142 over an opening 144 that defines the location for placement of the process kit 120. The electrolyte collector 140 includes an inner wall 146, an outer wall 148 and a bottom 147 connecting the walls 147, 148. An electrolyte outlet 149 is disposed through the bottom 147 of the electrolyte collector 140 and connected to an electrolyte replenishing system 132 through tubes, hoses, pipes or other fluid transfer connectors.

The head assembly 110 is mounted onto a head assembly frame 152. The head assembly frame 152 includes a mounting post 154 and a cantilever arm 156. The mounting post 154 is mounted onto the base 142 of the electroplating process cell 100, and the cantilever arm 156 extends laterally from an upper portion of the mounting post 154. Preferably, the mounting post 154 provides rotational movement with respect to a vertical axis along the mounting post to allow rotation of the head assembly 110. The head assembly 110 is attached to a mounting plate 160 disposed at the distal end of the cantilever arm 156. The lower end of the cantilever arm 156 is connected to a cantilever arm actuator 157, such as a pneumatic cylinder, mounted on the mounting post 154. The cantilever arm actuator 157 provides pivotal movement of the cantilever arm 156 with respect to the joint between the cantilever arm 156 and the mounting post 154. When the cantilever arm actuator 157 is retracted, the cantilever arm 156 moves the head assembly 110 away from the process kit 120 to provide the spacing required to remove and/or replace the process kit 120 from the electroplating process cell 100. When the cantilever arm actuator 157 is extended, the cantilever arm 156 moves the head assembly 110 axially toward the process kit 120 to position the substrate in the head assembly 110 in a processing position.

The head assembly 110 generally comprises a substrate holder assembly 150 and a substrate assembly actuator 158. The substrate assembly actuator 158 is mounted onto the mounting plate 160, and includes a head assembly shaft 162 extending downwardly through the mounting plate 160. The lower end of the head assembly shaft 162 is connected to the substrate holder assembly 150 to position the substrate holder assembly 150 in a processing position and in a substrate loading position.

The substrate assembly actuator 158 additionally may be configured to provide rotary motion to the head assembly 110. The rotation of the substrate during the electroplating process generally enhances the deposition results. Preferably, the head assembly 110 is rotated between about 2 rpm and about 20 rpm during the electroplating process. The head assembly 110 can also be rotated as the head assembly 100 is lowered to position the substrate in contact with the electrolyte in the process cell as well as when the head assembly 110 is raised to remove the substrate from the electrolyte in the process cell. The head assembly 110 is preferably rotated at a high speed (i.e., >20 rpm) after the head assembly 110 is lifted from the process cell to enhance removal of residual electrolyte on the head assembly 110 and substrate.

The substrate holder assembly 150 generally comprises a thrust plate 164 and a cathode contact ring 166 that are suspended from a hanger plate 136. The hanger plate 136 is coupled to the head assembly shaft 162. The cathode contact ring 166 is coupled to the hanger plate 136 by hanger pins 138. The hanger pins 138 allows the cathode contact ring 166 when mated with the weir 178, to move to closer to the hanger plate 136, thus allowing the substrate held by the thrust plate 164 to be sandwiched between the hanger plate 136 and thrust plate 164 for processing.

Figure 2:
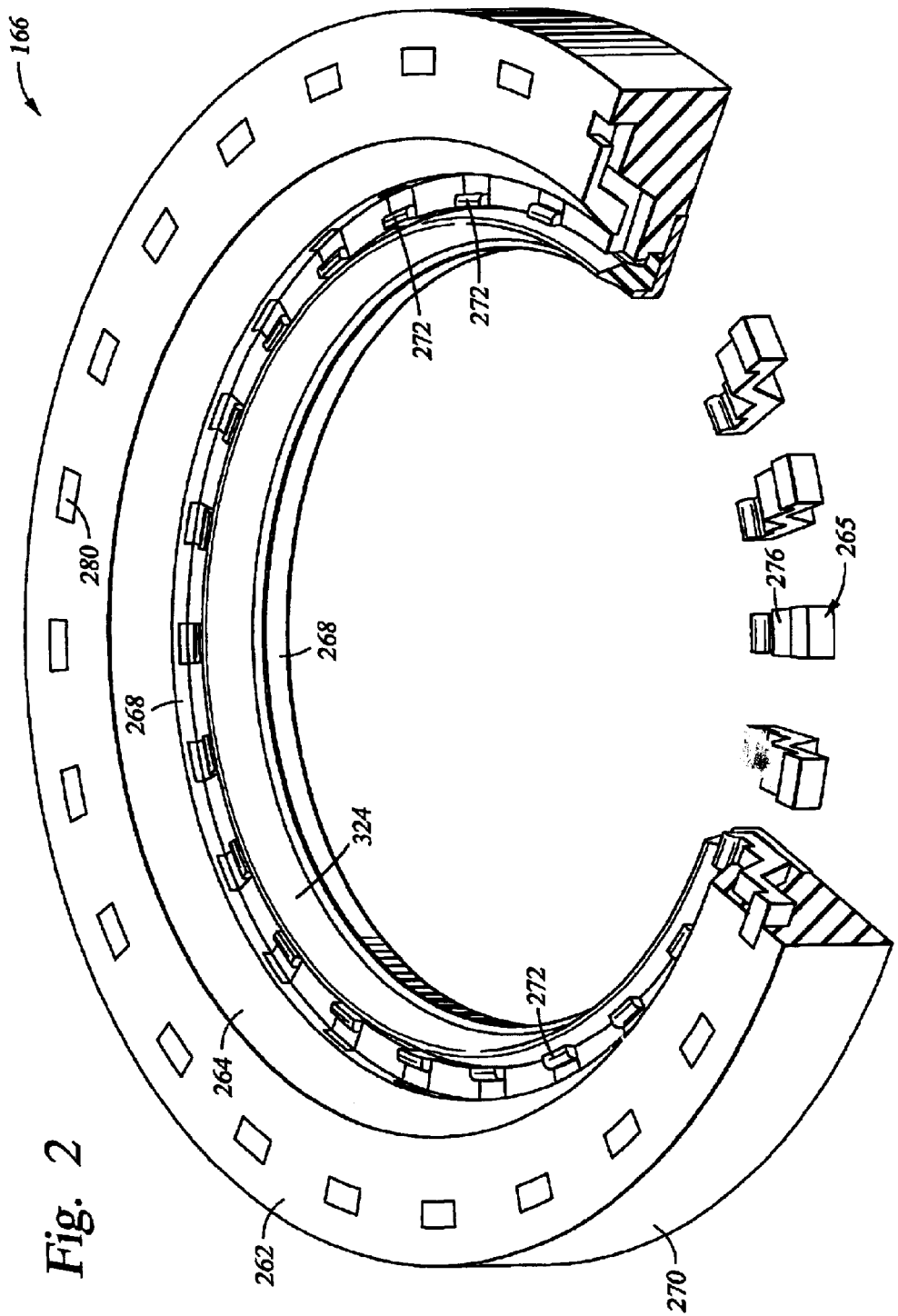
FIG. 2 is a partial cross sectional perspective view of one embodiment of a cathode contact ring.

FIG. 2 is a cross sectional view of one embodiment of a cathode contact ring 166. In general, the contact ring 166 comprises an annular body having a plurality of conducting members disposed thereon. The annular body is constructed of an insulating material to electrically isolate the plurality of conducting members. Together the body and conducting members form a diametrically interior substrate seating surface which, during processing, supports a substrate and provides a current thereto.

The contact ring 166 generally comprises a plurality of conducting members 265 at least partially disposed within an annular insulative body 270. The insulative body 270 is shown having a flange 262 and a downward sloping shoulder portion 264 leading to an upper portion 266 of an inner ring surface 268. The insulative body 270 generally comprises a ceramic, plastic or other substantially rigid, electrically insulating material. For example, the body 270 may be comprised of alumina ($Al_2O_3$), polyvinylidenefluoride (PVDF), perfluoroalkoxy resin (PFA), fluoropolymers like TEFLON®, and TEFZEL®, and similar materials.

The conducting members 265 are defined by a plurality of outer electrical contact pads 280 annularly disposed on the flange 262, a plurality of inner electrical contact pads 272 extending inward from the shoulder 264, and a plurality of embedded conducting connectors 276 which link the pads 272, 280 to one another. The conducting members 265 are isolated from one another by the insulative body 270. The outer contact pads 280 are coupled to a power supply (not shown) to deliver current and voltage to the inner contact pads 272 via the connectors 276 during processing. The inner contact pads 272 supply the current and voltage to a substrate by maintaining contact around a peripheral portion of the substrate. Thus, in operation the conducting members 265 act as discrete current paths electrically connected to a substrate.

The conducting members 265 typically comprise copper (Cu), platinum (Pt), tantalum (Ta), titanium (Ti), gold (Au), silver (Ag), stainless steel or other conducting materials. Alternatively, the conducting members 265 may be comprised of a base material coated with a conducting material. For example, the conducting members 265 may be made of copper base and be coated with platinum. Alternatively, coatings such as tantalum nitride, titanium nitride, rhodium, gold, copper or silver on a conductive base material such as stainless steel, molybdenum, copper and titanium may be used. Optionally, the inner contact pads 272 may comprise a material resistant to oxidation such as platinum, gold, silver or other noble metal. Further, since the contact pads 272, 280 are typically separate units bonded to the conducting connectors 276, the contact pads 272, 280 may each comprise the same or different material while the conducting members 265 one of the same or yet another material. Either or both of the pads 272, 280 and conducting connectors 276 may be coated with a conducting material.

In addition to being a function of the contact material, the total resistance of each circuit is dependent on the geometry, or shape, of the inner contact pads 272 and the force supplied by the contact ring 166. These factors define a constriction resistance, $R_{CR}$, at the interface of the inner contact pads 272 and the inner ring surface 268 due to asperities between the two surfaces. Generally, as the applied force is increased the apparent area is also increased. The apparent area is, in turn, inversely related to $R_{CR}$ so that an increase in the apparent area results in a decreased $R_{CR}$. Thus, to minimize overall resistance it is preferable to maximize force. The maximum force applied in operation is limited by the yield strength of a substrate which may be damaged under excessive force and resulting pressure. However, because pressure is related to both force and area, the maximum sustainable force is also dependent on the geometry of the inner contact pads 272. Thus, while the contact pads 272 may have a flat upper surface as in FIG. 2, other shapes may be used to advantage. For example, knife-edge and hemispherical contact pads may be utilized. A person skilled in the art will readily recognize other shapes that may be used to advantage. A more complete discussion of the relation between contact geometry, force, and resistance is given in *Ney Contact Manual*, by Kenneth E. Pitney, The J. M. Ney Company, 1973, which is hereby incorporated by reference in its entirety.

The number of connectors 276 may be varied depending on the particular number and size of contact pads 272 desired. For example, a contact ring 166 configured to process a 200 mm substrate may include up to 36 contact pads 272 spaced equally around the ring. However, more or a single contact pad 272 which may circumscribe the contact ring 166 may also be utilized.

Figure 3:
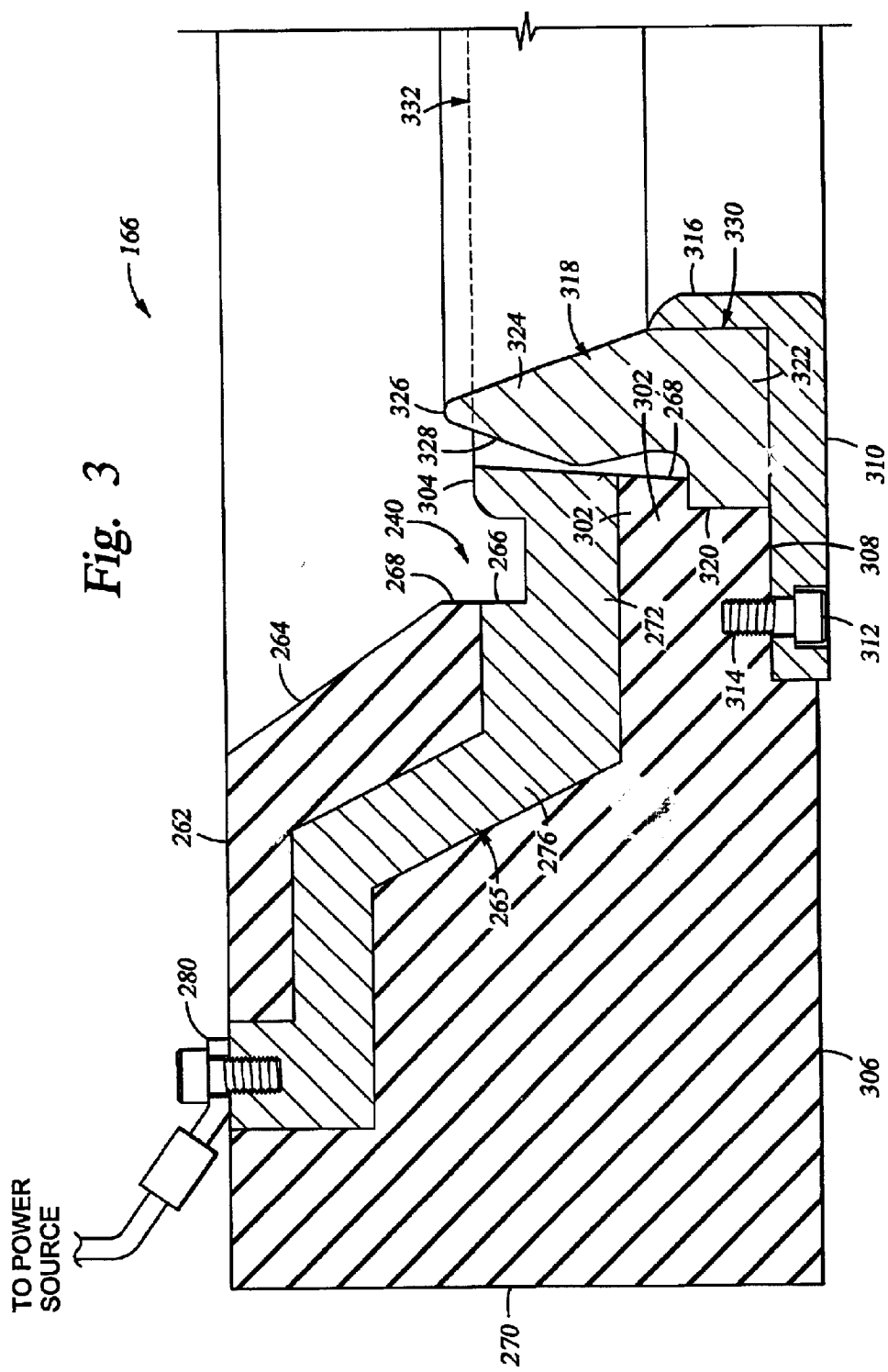
FIG. 3 is a partial sectional view of the cathode contact ring of FIG. 2.

FIG. 3 depicts a sectional view of one embodiment of a contact ring 166 illustrating the inner contact pad 272 extending inward from the shoulder 264. Generally, the contact ring 166 includes a support flange 302 that extends radially inward from the shoulder 264 below the inner contact pads 272 to a lower portion of the inner ring surface 268. The support flange 302 supports the inner contact pad 272 and maintains planarity of a contact surface 304 of the inner contact pad 272 while the substrate is seated thereon during processing. Additionally, the support flange 302 includes a recess 308 disposed on a bottom surface 306 and/or inner ring surface 268 of the contact ring 166.

The recess 308 is configured to accept a clamp ring 310 that retains a first seal 318 to the contact ring 166. The clamp ring 310 may be an integral part of the contact ring 166, or be comprised of a material compatible with the plating fluid 130. In one embodiment, the clamp ring 310 is fastened to the contact ring 166 by a plurality of screws 312 threaded into a threaded hole 314 in the insulative body 270. The clamp ring 310 includes an upturned member 316 that defines a seal-receiving groove 330 between the upturned member 316 and the support flange 302.

The first seal 318 generally is configured to provide a fluid seal between the body 270 of the contact ring 166 and the substrate when the substrate is disposed on the inner contact pad 272 (see line 322). The first seal 318 is generally comprised of a material compatible with the polishing fluid 130 and having a durometer that effectively seals against the substrate without stressing or damaging the substrate's surface. An example of one suitable seal material is ethylene propylene diene terpolymer (EDPM). The first seal 318 may include a variety of profiles, including circular, square, lip-seals or other shapes.

The first seal 318 may include a variety sealing means such as gaskets, o-rings, lip seals, cup seals, lobed rings and other types of fluid seals. In one embodiment, the first seal 318 includes a base 322 having a lip 324 extending therefrom. The base 322 is generally annular in form and is configured to be retained by the seal-receiving groove 330. Optionally, an undercut 320 may be disposed in the support flange 302. As the base 322 may be configured with a diameter that fits within the groove 300 and is thus retained by the support flange 302. The lip 324 includes a first sealing surface 326 and a second sealing surface 328. The first sealing surface 326 is generally disposed on the lip 324 opposite the base 322 and provides a seal between the substrate and the first seal 318. The second sealing surface 328 is generally disposed on the radially outer portion of the lip 324 and contacts the inner contact pad 272 and/or the inner ring surface 268 of the support flange 302 when the lip 324 is compressed to line 332 by the substrate seated on the contact pad 272. Additionally or in the alternative, the base 322 may provide a seal between the first seal 318 and insulative body 270.

The lip 324 of the first seal 318, in a non-compressed or "free" state, generally extends radially inward of the base 322. The lip 324 extends from the base 322 and tapers to the first sealing surface 326. The shape of the first seal 318 generally allows the lip 324 to move radially inwards when compressed and to return to its original configuration relative to the base 322 as the force upon the seal 318 is removed as further described below.

The inner ring surface 267 and the contact surface 304 of the inner contact pad 272 generally define a substrate receiving pocket 340. The receiving pocket 340 is generally configured to locate the surface relative to the contact ring 166 and assure the entire perimeter of the substrate make electrical contact with the contact ring 166 during processing.

Figure 4:
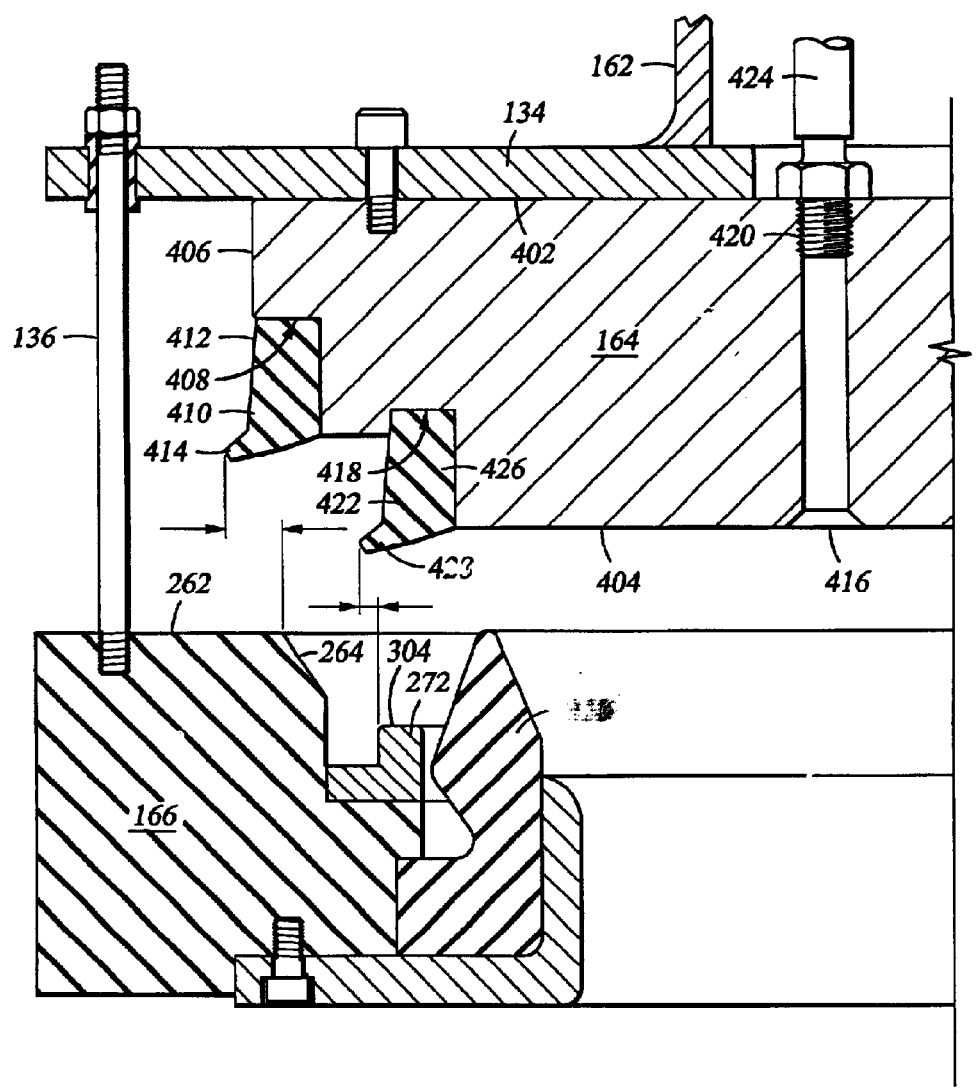
FIG. 4 is a partial cross sectional perspective view of one embodiment of a thrust plate.

FIG. 4 depicts one embodiment of the thrust plate 164. The thrust plate 164 is generally cylindrical in form and includes a top surface 402 and a bottom surface 404. The thrust plate 164 is generally comprised or coated with a material compatible with the plating fluid 130.

A perimeter 406 of the thrust plate 162 generally includes a groove or notch 408 that is adapted to receive a second seal 410. The second seal 410 generally provides a fluid seal between the thrust plate 162 and the flange 262 of the contact ring 166. The second seal 410 may include a variety sealing means such as gaskets, o-rings, lip seals, cup seals, lobed rings and other types of fluid seals The second seal 410 is generally comprised of a material compatible with the polishing fluid 130 and having a durometer that effectively seals against the contact ring 166. An example of one suitable seal material is ethylene propylene diene terpolymer (EDPM). The second seal 410 may include a variety of profiles, including circular, square, lip-seals or other shapes.

In the embodiment depicted in FIG. 4, the second seal 410 includes a base 412 and a lip 414. The base 412 is generally disposed in the notch 408. The lip 414 typically extends from the base 412 downwards and radially outwards. The lip 414 is configured to seal against the flange 262 of the contact ring 166 and, as such, is disposed radially outward than the intersection of the flange 262 and shoulder 264 of the contact ring 166. Generally, the second seal 410 is configured similar to the first seal 318.

The bottom 404 of the thrust plate 164 generally includes a port 416 and a groove or notch 418. The port 416 is coupled to a fitting 420 disposed in the top surface 402 of the thrust plate 164. The fitting 420 is coupled by a supply tube 424 to a fluid source (not shown) that supplies pressure or vacuum to retain and dechuck the substrate from the bottom surface 404 of the thrust plate 164.

The notch 418 is generally adapted to receive a third seal 422. The third seal 422 is adapted to contact the substrate to facilitate vacuum chucking of the substrate. The third seal 422 generally extends beyond the bottom 404 in its un-compressed state and it typically comprises of a material compatible with the plating fluid 130 and of a durometer that promotes sealing with the substrate while minimizing stress and damage to the substrate. The third seal 422 may include a variety sealing means such as gaskets, o-rings, lip seals, cup seals, lobed rings and other types of fluid seals. The profile of the third seal 422 may vary as discussed relative to the first and second seals 318, 410.

Figure 8:
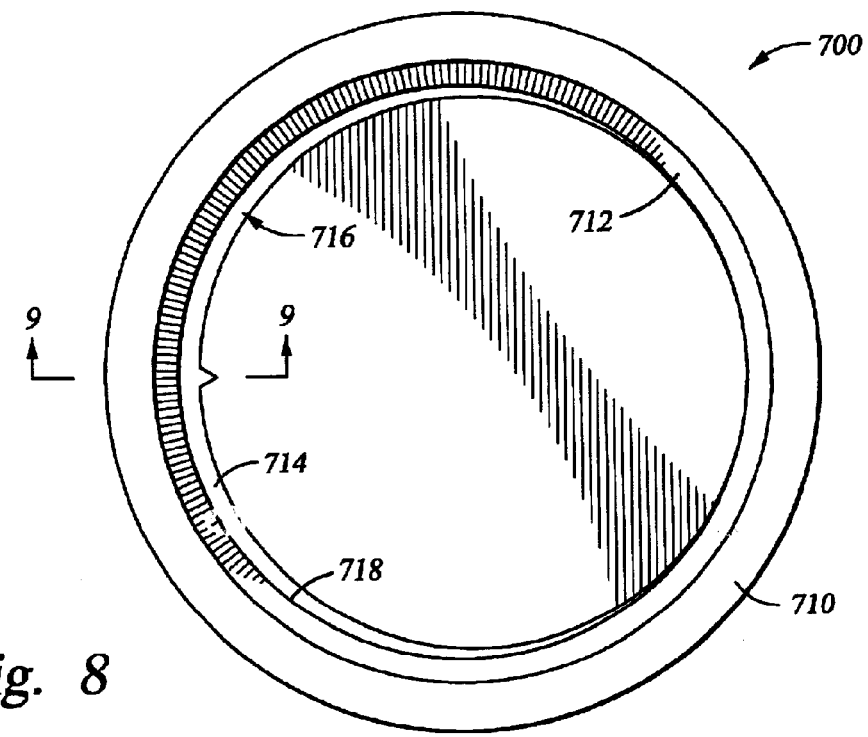
FIG. 8 is a partial cross sectional perspective view of another embodiment of a cathode contact ring.

In the embodiment depicted in FIG. 4, the third seal 422 includes a base 426 and a lip 428. The base 426 is generally disposed in the notch 418. The lip 428, in a non-compressed or "free" state, typically extends from the base 426 downwards and radially outwards. The lip 428 is configured to seal against the substrate inward of the edge of the substrate or locating indicia (i.e., flat or notch disposed therein) to prevent plating fluid from entering the region between the seals 410, 422 and contacting and contaminating the inner contact pads 272 (see FIGS. 8 and 9). Typically, the lip 428 is configured to contact the substrate radially outward of the contact surface 320 of the inner contact pad. Generally, the third seal 422 is configured similar to the first seal 318 and/or second seal 410.

Figure 5:
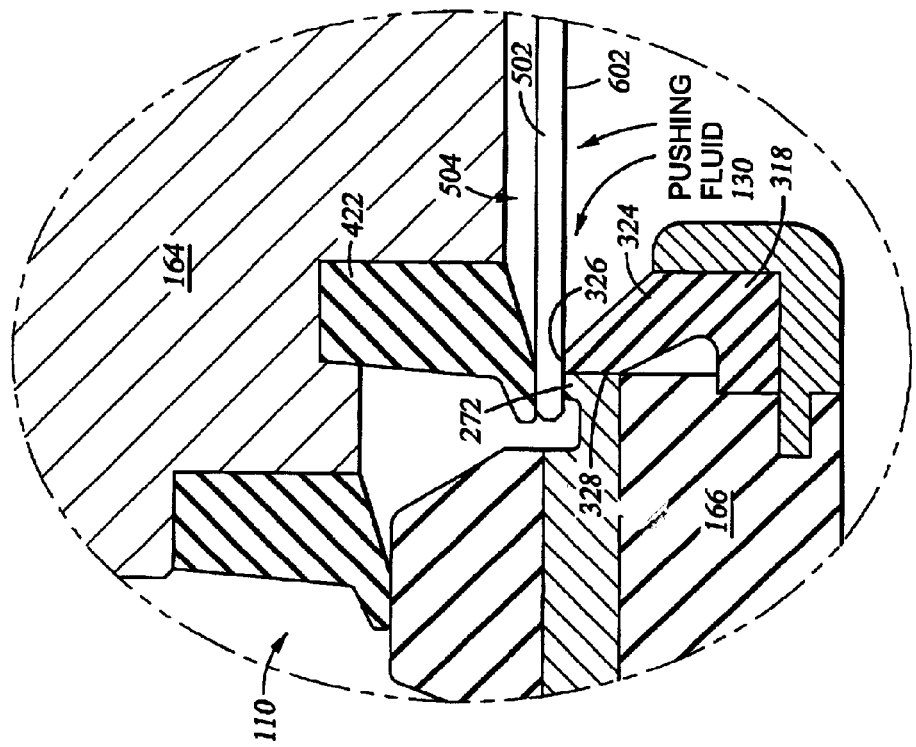
FIGS. 5 and 6 are cross sectional views of the cathode contact ring and thrust plate engaging a substrate.
Figure 6:
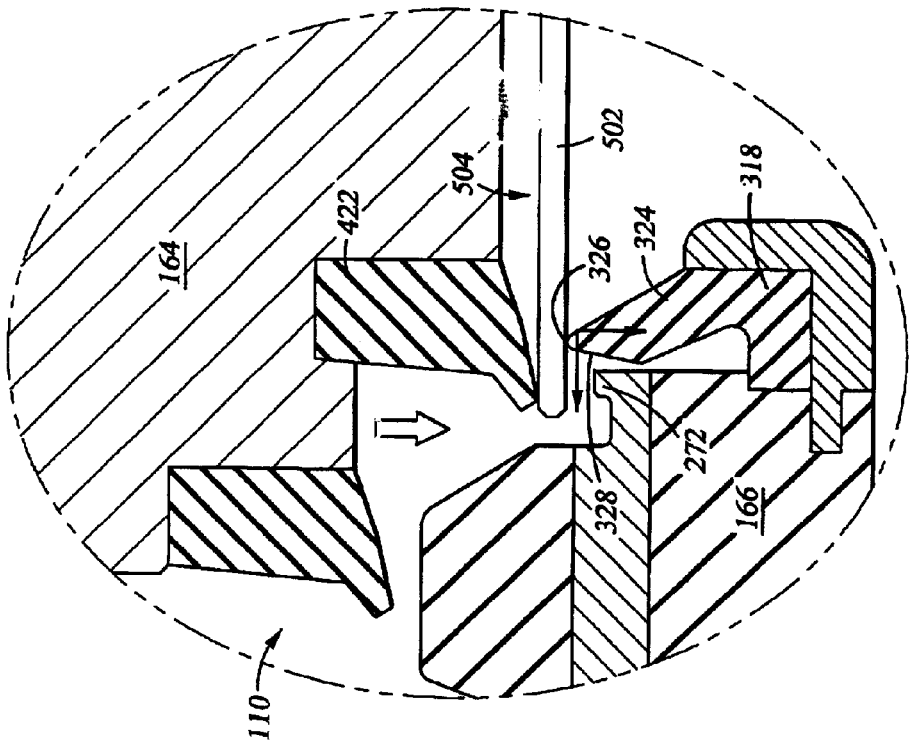

FIGS. 5 and 6 depict the head assembly 110 in one mode of operation. Referring to FIG. 5, a substrate 502 is disposed adjacent the thrust plate 164 and in contact with the third seal 422. At least a partial vacuum is drawn in a plenum 504 defined between the thrust plate 164 and substrate 502 to chuck or retain the substrate to the thrust plate 164. The head assembly 110 is moved towards the contact ring 166. As the substrate 502 nears the contact ring 166, the substrate sealingly contacts the lip 324 of the first seal 318 at the first sealing surface 326. The first seal 318 is deformed as the substrate 502 moves closer to the contact pads 272 disposed on the contact ring 166. The deformation of the first seal 318 causes the lip 324 to move downward and outward. The outward movement of the lip 324 causes a second sealing surface 328 to sealing contact the inner diameter of the flange 302.

As the thrust plate 164 continues to move towards the contact ring 166, the second seal 410 sealing engages the contact plate 166 as shown in FIG. 6. The substrate is now sandwiched between the first seal 318 and third seal 422 which respectively define inner boundaries of an exclusion zone 604. The second seal 410 defined an outer boundary of the exclusion zone 604. Thus, as the polishing fluid 130 is disposed on the plating surface 602 of the substrate 502, an edge 606 of the substrate 502 which is encapsulated by the exclusion zone 604 is isolated from contact with the polishing fluid 130. As the contact pads 272 are disposed within the exclusion zone 604, contamination of the contact pads 272 by the polishing fluid 130 and deposition build-up is substantially eliminated, thus extending plating uniformity and extending the service life of the contact ring 166. Additionally, the compression of first seal 318 assists in releasing the substrate from the contact ring 166 after deposition.

Figure 7:
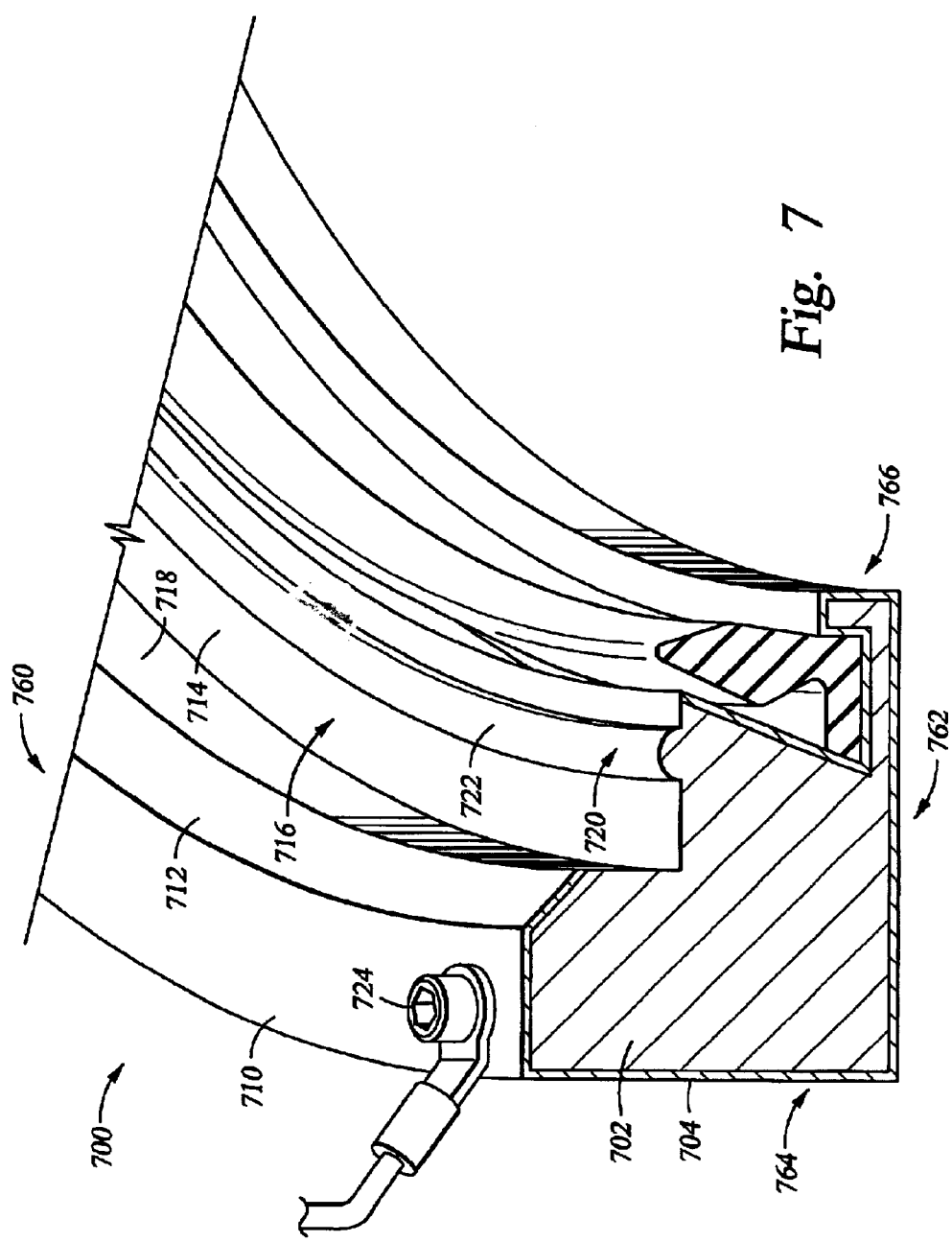
FIG. 7 is a partial plan view of a substrate illustrating an exclusion zone relative to a notch.

FIG. 7 depicts another embodiment of a contact ring 700. Generally, the contact ring 700 is comprised of a conductive body 702 that is at least partially encapsulated by an insulating covering 704. The conductive body 702 is typically a metal such as copper, stainless steel, aluminum or other metal. The insulating covering 704 is typically a ceramic or plastic, for example, fluoropolymers, polyethylene or polyimide.

Generally, the conductive body 702 includes a top surface 760, a bottom surface 762, an outer diameter 764 and an inner diameter 766. The top surface 760 includes a flange 710 and a substrate seating surface 714 coupled between a shoulder 712. The shoulder 712 is generally disposed at an acute angle relative to the centerline of the contact ring 700 to center the substrate relative to the contact ring 700. Optionally, the substrate seating surface 714 may be recessed from the shoulder 712 to form a substrate receiving pocket 716. The substrate receiving pocket 716 generally includes a cylindrical wall 718 having a diameter configured slightly larger than the substrate (see FIGS. 9 and 10) so that a first seal, coupled to the contact ring 700, remains in sealing contact with the substrate even in conditions where a substrate 800 is located to one side of the pocket 716 such that a flat or notch 802 of the substrate 800 is biased towards a centerline 804 of the ring 700.

Figure 10:
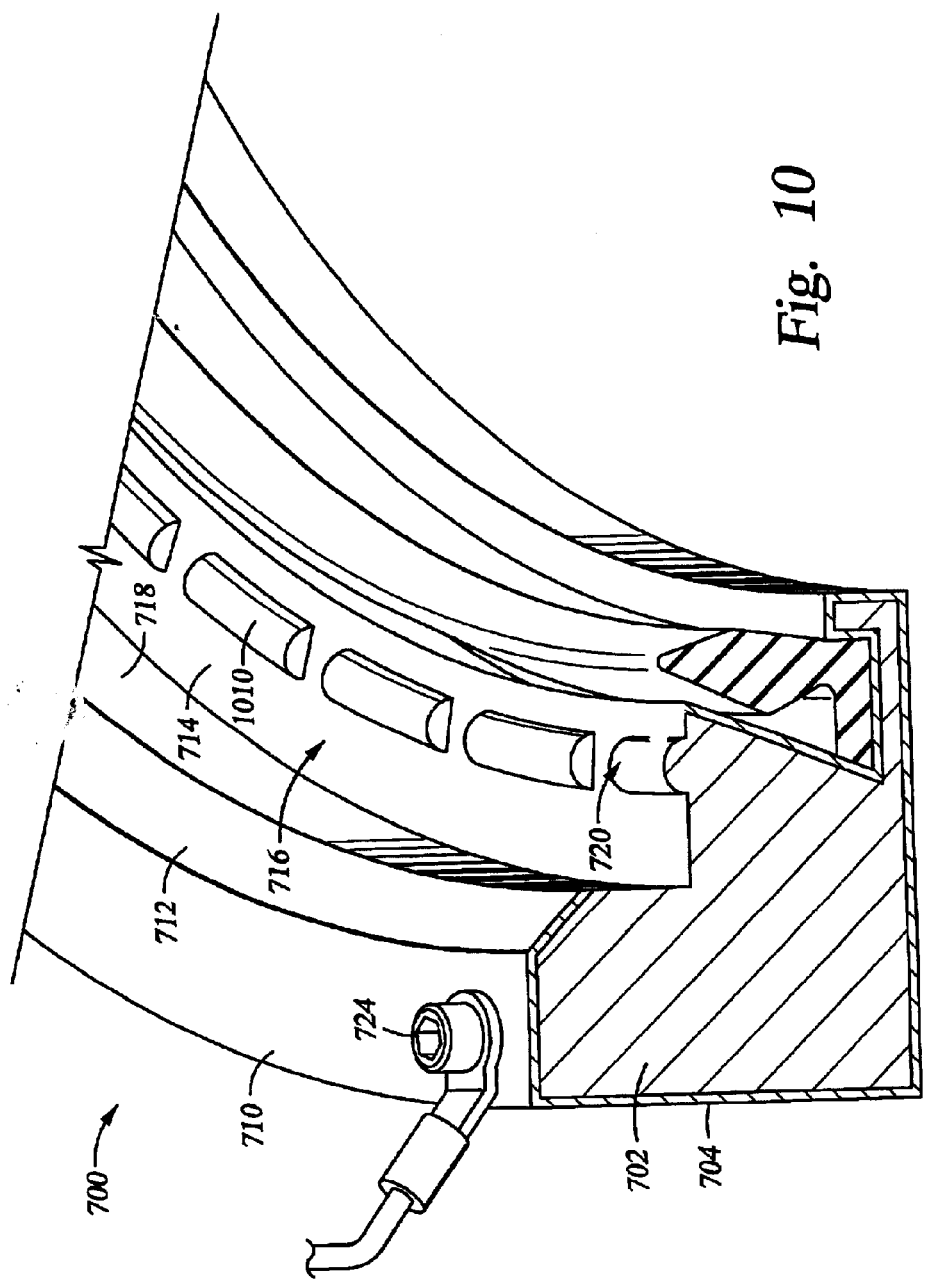
FIG. 10 is a partial cross sectional perspective view of another embodiment of a cathode contact ring.

Referring back to FIG. 7, the contact ring 700 generally includes one or more electrical contact pads 720. The electrical contact pads 720 generally comprise a portion of the conductive body 702 that extends from the substrate seating surface 714. The electrical contact pads 720 are typically formed by removing a portion of the insulative covering 704 on the substrate seating surface 714. Optionally, the covering 704 may be removed from the additional portions of the substrate seating surface 714 or other portions of the contact ring 700. The exposed conductive body 702 may be machined to form a single contact ring 722 circumscribing the substrate seating surface 714. Alternatively, as depicted in FIG. 10, the electrical contact pads 720 may be configured as a plurality of contacts 1010, such as segmented arcs, hemispherical contacts or other shapes. Other methods of fabrication may alternatively be utilized, for example, pre-forming the contacts pads 720 in the conductive body 702, then masking the pads 720 before applying the insulative covering 704 to leave the pads 720 exposed, or removing the covering 704 only from the pads 720 after application of the coating 704 among other methods.

Power is generally supplied to the substrate through the electric contact pads 720 through one or more terminals 724 coupled to the body 702 through the insulative covering 704. The terminals 724 are typically coupled to a power source (not shown).

Figure 9:
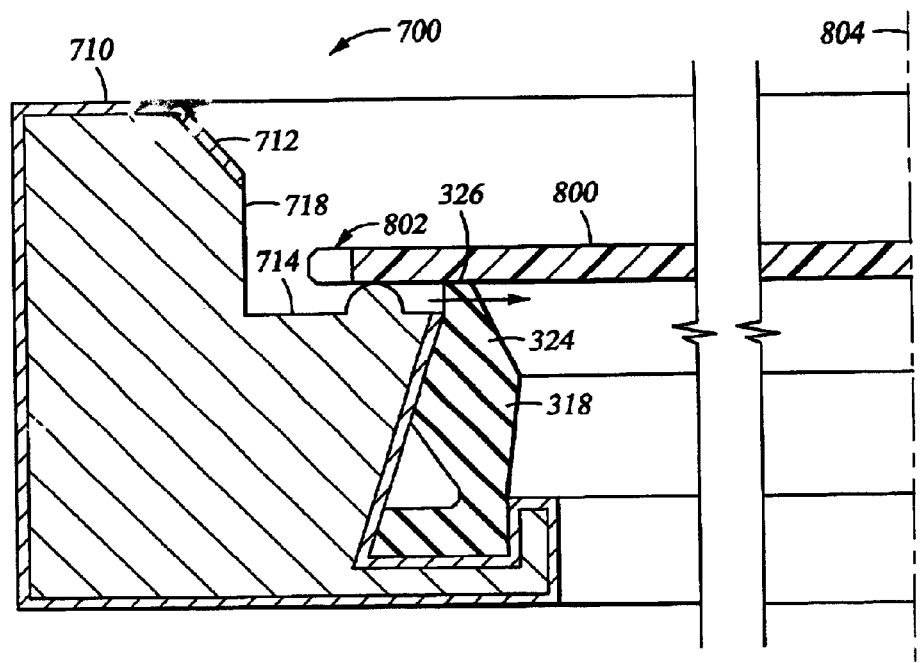
FIG. 9 is a partial cross sectional perspective view of another embodiment of a cathode contact ring.

Additionally, depicted in FIG. 9 is a substrate wiping action of the first seal 318 which keeps plating fluids from contaminating the contact pads 720. Generally, as the substrate 800 is moved away from the contact ring 700, the lip 324 of the first seal 318 moves radially inwards (i.e., towards the centerline 804) as the compression of the seal 318 is removed. As the lip 324 moves inward, the first sealing surface 326 moves across a feature side 902 of the substrate 800, wiping the plating fluid away from the contact pads 720 as the substrate 800 is removed from the contact ring 700. The wiping action of the lip 324 substantially prevents plating fluid from dipping or otherwise contaminating the contact pads 720 which may adversely affect the plating of subsequent substrates.

Referring back to FIG. 1, the process kit 120 is generally positioned below the substrate holder assembly 150. The process kit 120 generally comprises a bowl 130, a container body 172, an anode assembly 174 and a filter 176. Preferably, the anode assembly 174 is disposed below the container body 172 and attached to a lower portion of the container body 172, and the filter 176 is disposed between the anode assembly 174 and the container body 172. The container body 172 is preferably a cylindrical body comprised of an electrically insulative material, such as ceramics, plastics, plexiglass (acrylic), lexane, PVC, CPVC or PVDF. Alternatively, the container body 172 can be made from a metal, such as stainless steel, nickel or titanium, which is coated with an insulating layer, such as Teflon®, PVDF, plastic, rubber and other combinations of materials that do not dissolve in the electrolyte and can be electrically insulated from the electrodes (i.e., the anode and cathode of the electroplating system). The container body 172 is preferably sized and adapted to conform to the substrate plating surface and the shape of the substrate being processed through the system, typically circular or rectangular in shape. One preferred embodiment of the container body 172 comprises a cylindrical ceramic tube having an inner diameter that has about the same dimension as or slightly larger than the substrate diameter. The inventors have discovered that the rotational movement typically required in typical electroplating systems is not required to achieve uniform plating results when the size of the container body conforms to about the size of the substrate plating surface.

An upper portion of the container body 172 extends radially outward to form an annular weir 178. The weir 178 extends over the inner wall 146 of the electrolyte collector 140 and allows the electrolyte to flow into the electrolyte collector 140. The upper surface of the weir 178 preferably matches the lower surface of the cathode contact ring 166. Preferably, the upper surface of the weir 178 includes an inner annular flat portion 180, a middle inclined portion 182 and an outer declined portion 184. When a substrate is positioned in the processing position, the substrate plating surface is positioned above the cylindrical opening of the container body 172, and a gap for electrolyte flow is formed between the lower surface of the cathode contact ring 166 and the upper surface of the weir 178. The lower surface of the cathode contact ring 166 is disposed above the inner flat portion 180 and the middle inclined portion of the weir 178. The outer declined portion 184 is sloped downwardly to facilitate flow of the electrolyte into the electrolyte collector 140.

A lower portion of the container body 172 extends radially outward to form a lower annular flange 186 for securing the container body 172 to the bowl 130. The outer dimension (i.e., circumference) of the annular flange 186 is smaller than the dimensions of the opening 144 and the inner circumference of the electrolyte collector 140 to allow removal and replacement of the process kit 120 from the electroplating process cell 100. Preferably, a plurality of bolts 188 are fixedly disposed on the annular flange 186 and extend downwardly through matching bolt holes on the bowl 130. A plurality of removable fastener nuts 190 secure the process kit 120 onto the bowl 130. A seal 187, such as an elastomer O-ring, is disposed between container body 172 and the bowl 130 radially inward from the bolts 188 to prevent leaks from the process kit 120. The nuts/bolts combination facilitates fast and easy removal and replacement of the components of the process kit 120 during maintenance.

Preferably, the filter 176 is attached to and completely covers the lower opening of the container body 172, and the anode assembly 174 is disposed below the filter 176. A spacer 192 is disposed between the filter 176 and the anode assembly 174. Preferably, the filter 176, the spacer 192, and the anode assembly 174 are fastened to a lower surface of the container body 172 using removable fasteners, such as screws and/or bolts. Alternatively, the filter 176, the spacer 192, and the anode assembly 174 are removably secured to the bowl 130.

The anode assembly 174 preferably comprises a consumable anode that serves as a metal source in the electrolyte.

Alternatively, the anode assembly 174 comprises a non-consumable anode, and the metal to be electroplated is supplied within the electrolyte from the electrolyte replenishing system 132. The anode assembly 174 may be a self-enclosed module having a porous anode enclosure 194 preferably made of the same metal as the metal to be electroplated, such as copper. Alternatively, the anode enclosure 194 is made of porous materials, such as ceramics or polymeric membranes. A soluble metal 196, such as high purity copper for electro-chemical deposition of copper, is disposed within the anode enclosure 194. The soluble metal 196 preferably comprises metal particles, wires or a perforated sheet. The porous anode enclosure 194 also acts as a filter that keeps the particulates generated by the dissolving metal within the anode enclosure 194. As compared to a non-consumable anode, the consumable (i.e., soluble) anode provides gas-generation-free electrolyte and minimizes the need to constantly replenish the metal in the electrolyte.

An anode electrode contact 198 is inserted through the anode enclosure 194 to provide electrical connection to the soluble metal 196 from a power supply. Preferably, the anode electrode contact 198 is made from a conductive material that is insoluble in the electrolyte, such as titanium, platinum and platinum-coated stainless steel. The anode electrode contact 198 extends through the bowl 130 and is connected to an electrical power supply. Preferably, the anode electrical contact 198 includes a threaded portion 197 for a fastener nut 199 to secure the anode electrical contact 198 to the bowl 130, and a seal 195, such as an elastomer washer, is disposed between the fastener nut 199 and the bowl 130 to prevent leaks from the process kit 120.

The bowl 130 generally comprises a cylindrical portion 102 and a bottom portion 104. An upper annular flange 106 extends radially outward from the top of the cylindrical portion 102. The upper annular flange 106 includes a plurality of holes 108 that matches the number of bolts 188 from the lower annular flange 186 of the container body 172. To secure the upper annular flange 106 of the bowl 130 and the lower annular flange 186 of the container body 172, the bolts 188 are inserted through the holes 108, and the fastener nuts 190 are fastened onto the bolts 188. Preferably, the outer dimension (i.e., circumference) of the upper annular flange 106 is about the same as the outer dimension (i.e., circumference) of the lower annular flange 186. Preferably, the lower surface of the upper annular flange 106 of the bowl 130 rests on a support flange of the electroplating process cell 100 when the process kit 120 is positioned thereon.

The inner circumference of the cylindrical portion 102 accommodates the anode assembly 174 and the filter 176. Preferably, the outer dimensions of the filter 176 and the anode assembly 174 are slightly smaller than the inner dimension of the cylindrical portion 102 to force a substantial portion of the electrolyte to flow through the anode assembly 174 first before flowing through the filter 176. The bottom portion 104 of the bowl 130 includes an electrolyte inlet 134 that connects to an electrolyte supply line from the electrolyte replenishing system 132. Preferably, the anode assembly 174 is disposed about a middle portion of the cylindrical portion 102 of the bowl 130 to provide a gap for electrolyte flow between the anode assembly 174 and the electrolyte inlet 134 on the bottom portion 104.

The electrolyte inlet 134 and the electrolyte supply line are preferably connected by a releasable connector that facilitates easy removal and replacement of the process kit 120. When the process kit 120 needs maintenance, the electrolyte is drained from the process kit 120, and the electrolyte flow in the electrolyte supply line is discontinued and drained. The connector for the electrolyte supply line is released from the electrolyte inlet 134, and the electrical connection to the anode assembly 174 is also disconnected. The head assembly 110 may be raised or rotated to provide clearance for removal or service of the process kit 120.

While the foregoing is directed to the preferred embodiment of the present invention, other and further embodiments of the invention may be devised without departing from the basic scope thereof. The scope of the invention is determined by the claims which follow.

What is claimed is:

1. Apparatus for electro-chemical deposition on a substrate, comprising:
   an annular contact ring;
   one or more electrical contact pads disposed on the contact ring;
   a first seal disposed inward of the electrical contact pad and providing a seal with the contact ring;
   a thrust plate adapted to move axially relative to the contact ring;
   a second seal coupled to a side of the thrust plate facing the contact ring; and wherein the first seal further comprises:
     a base disposed in a groove at least partially formed in the contact ring; and
     a lip extending from the base and flaring radially outward towards the contact pads, the lip having at least one sealing surface.

2. The apparatus of claim 1, wherein the lip further comprises:
   a first sealing surface adapted to seal with the substrate; and
   a second sealing surface adapted to seal with the contact ring.

3. The apparatus of claim 1, wherein the contacting further comprises:
   a first surface;
   a shoulder coupled to the first surface;
   a substrate support surface extending inward from the shoulder and supporting the electrical contact pad thereon, the substrata support surface and shoulder defining a substrate receiving pocket; and
   an inner ring surface disposed radially inward of the substrate support surface, the inner ring surface in sealing communication with the first seal.

4. The apparatus of claim 1 further comprising a third seal disposed between and selectively sealing the thrust plate and the contact ring.

5. The apparatus of claim 4, wherein at least one of the first, second or third seal is comprised of an elastomer.

6. The apparatus of claim 4, wherein the second seal extends further from a bottom of the thrust plate and the third seal.

7. The apparatus of claim 4, wherein the thrust plate further comprises:
   a first groove disposed in a bottom of the thrust plate, the first seal disposed in the first groove; and
   a second groove disposed outward of the first groove, the third seal disposed in the second groove.

8. The apparatus of claim 1, wherein the thrust plate and the first seal define a plenum that is evacuated to chuck the substrate to the thrust plate.

9. The apparatus of claim 1, wherein the first and second seal are adapted to sandwich the substrate therebetween when the contact ring and the thrust plate are moved towards each other.

10. Apparatus for electro-chemical deposition on a substrate, comprising:
an annular contact ring;
one or more electrical contact pads disposed on the contact ring;
a first seal disposed inward of the electrical contact pad and in sealing communication with the contact ring;
a thrust plate adapted to move axially relative to the contact ring;
a second seal coupled to the thrust plate;
a third seal coupled to the thrust plate radially outward of the second seal, the third seal contacting the contact ring and the thrust plate when the contact ring and the thrust plate are moved towards each other.

11. The apparatus of claim 10, wherein the contact ring further comprises:
a first surface;
a shoulder coupled to the first surface;
a substrate support surface extending inward of the shoulder and supporting the electrical contact pad thereon, the substrate support surface end shoulder defining a substrate receiving pocket; and
an inner ring surface disposed radially inward of the substrate support surface.

12. The apparatus of claim 10, wherein the first and second seal are adapted to sandwich the substrate therebetween when the contact ring and the thrust plate are moved towards each other.

13. The apparatus of claim 10, wherein the contact ring further comprises:
a conductive material covered by an insulative covering, the electrical contact pad formed where the insulative covering is removed to expose a portion of the conductive material.

14. The apparatus of claim 10, wherein the contact ring further comprises:
an insulative body having the electrical contact pad disposed thereon; and
a plurality of conductive connectors at least partially embedded within the insulative body and coupled to the electrical contact pad.

15. Apparatus for electro-chemical deposition on a substrate, comprising:
an annular contact ring having a conductive body covered by an insulative covering;
a first means for sealing the contact ring to a feature side of the substrate and for wiping the feature side of the substrate in a radially inward direction when disengaged from the substrate;
a thrust plate adapted to move axially relative to the contact ring;
a second means for sealing the thrust plate to a backside side of the substrate, wherein the first and second means define an inner boundary of an exclusion zone encapsulating an edge of the substrate; and
one or more electrical contact pads formed by removing a portion of the insulative covering of the contact ring in the exclusion zone.

16. The apparatus of claim 15, wherein the first means is a gasket, o-ring, lip seal, cup seal, lobed ring or fluid seal.

17. The apparatus of claim 15, wherein the second means is a gasket, o-ring, lip seal, cup seal, lobed ring or fluid seal.

18. The apparatus of claim 15 further comprising a third means for sealing the thrust plate to the contact ring, the third means defining an outer bounds of the exclusion zone.

19. The apparatus of claim 18, wherein the third means is a gasket, o-ring, lip seal, cup seal, lobed ring or fluid seal.

20. Apparatus for electro-chemical deposition on a substrate, comprising:
a container body;
an anode disposed in the container body;
a head assembly comprising:
an annular contact ring having a conductive body covered by an insulative covering;
a first seal providing a seal between the contact ring and a feature side of the substrate;
a thrust plate adapted to move axially relative to the contact ring; and
a second seal providing a seal between the thrust plate and a backside side of the substrate;
a third seal providing a seal between the thrust plate and the contact ring, wherein the first, second and third seal bound an exclusion zone encapsulating an edge of the substrate;
one or more electrical contact pads adapted to bias the substrate disposed in the exclusion zone; and
an electrolyte inlet positioned to supply electrolyte to an area of the substrate disposed radially inward of the first seal.

21. Apparatus for electro-chemical deposition on a substrate, comprising:
an insulative coating; and
an annular conductive body at least partially covered by the insulative coating, the conductive body comprising:
a top surface having a flange, a substrate seating surface and a shoulder disposed between the flange and the substrate seating surface, the flange at least partially covered by the insulative coating;
at least one exposed conductive pad disposed on the substrate seating surface;
an outer diameter coupled to the flange; and
a bottom surface coupled to the outer diameter opposite the top surface, the outer diameter and bottom surface at least partially covered by the insulative coating.

22. The apparatus of claim 21, wherein the conductive body further comprises:
a cylindrical wall disposed between the shoulder and the substrate seating surface, the cylindrical wall and the substrate seating surface defining a substrate receiving pocket.

23. The apparatus of claim 21 further comprising:
a seal disposed proximate an inner diameter of the conductive body.

24. The apparatus of claim 23, wherein the seal extends above the substrate seating surface when in a free state.

25. The apparatus of claim 21, wherein the at least one exposed conductive pad comprises a single ring.

26. The apparatus of claim 21, wherein the at least one exposed conductive pad comprises a plurality of pads.

27. The apparatus of claim 23, wherein the seal further comprises:
a base disposed in a groove at least partially formed in the contact ring; and
a lip extending upward from the base and flaring radially outward towards the conductive pads.

28. The apparatus of claim 27, wherein the seal is configured to wipe a side of the substrate disposed on the conductive pad in a radially inward direction when disengaged from the substrate.

29. The apparatus of claim 23, wherein the seal is configured to wipe a side of the substrate disposed on the conductive pad in a radially inward direction when disengaged from the substrate.

30. The apparatus of claim 10, wherein the first seal further comprises:
   a base disposed in a groove at least partially formed in the contact ring; and
   and a lip extending from the base and flaring radially outward towards the contact pads, the lip having at least one sealing surface.

31. The apparatus of claim 10, wherein the seal is configured to wipe a side of the substrate disposed or, the contact pad in a radially inward direction when disengaged from the substrate.

32. Apparatus for electro-chemical deposition on a substrate, comprising:
   an annular contact ring;
   one or more electrical contact pads disposed on the contact ring adapted to make electrical contact with a face of a substrate supported on the contact ring;
   a thrust plate adapted to move axially relative to the contact ring; and
   a seal disposed inward of the electrical contact pad and having a sealing up positioned to sealing engage the face of the substrate and the contact ring upon axial movement of the substrate into the contact with the seal, the seal positioned so that upon engagement of the substrate with the seal, the sealing lip adapted to move laterally outwards to wipe the face of the substrate, and upon disengagement of the substrate with the seal, the sealing lip adapted to move laterally inward to wipe the face of the substrate.

* * * * *

UNITED STATES PATENT AND TRADEMARK OFFICE
CERTIFICATE OF CORRECTION

PATENT NO. : 6,908,540 B2  
APPLICATION NO. : 09/905513  
DATED : June 21, 2005  
INVENTOR(S) : Arnold Kholodenko Page 1 of 1

It is certified that error appears in the above-identified patent and that said Letters Patent is hereby corrected as shown below:

In the Claims

Column 12, Claim 3, Line 42: Change "substrata" to --substrate--

Column 13, Claim 11, Line 22: Change "end" to --and--

Column 14, Claim 27, Line 58: Change "the" to --a--

Column 15, Claim 31, Line 10: Before "seal", insert --first--

Column 15, Claim 31, Line 11: Change "or," to --on--

Column 15, Claim 31, Line 12: Change "contact" to --conductive--

Column 16, Claim 32, Line 7: Before "engage", change "sealing" to --sealingly--

Column 16, Claim 32, Line 9: Before "contact", delete "the"

Signed and Sealed this

Twenty-ninth Day of August, 2006

JON W. DUDAS  
*Director of the United States Patent and Trademark Office*